(12) United States Patent
Chung et al.

(10) Patent No.: US 12,489,016 B2
(45) Date of Patent: Dec. 2, 2025

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Ming-Tsu Chung, Hsinchu (TW); Yung-Chi Lin, Su-Lin (TW); Yi-Hsiu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 386 days.

(21) Appl. No.: 18/184,968

(22) Filed: Mar. 16, 2023

(65) Prior Publication Data

US 2024/0312836 A1    Sep. 19, 2024

(51) Int. Cl.
| | |
|---|---|
| *H01L 21/768* | (2006.01) |
| *H01L 21/306* | (2006.01) |
| *H01L 21/78* | (2006.01) |
| *H01L 23/00* | (2006.01) |
| *H01L 23/522* | (2006.01) |
| *H01L 23/538* | (2006.01) |

(52) U.S. Cl.
CPC .. *H01L 21/76837* (2013.01); *H01L 21/30604* (2013.01); *H01L 21/76802* (2013.01); *H01L 21/78* (2013.01); *H01L 23/5226* (2013.01); *H01L 23/5389* (2013.01); *H01L 24/05* (2013.01); *H01L 2224/05571* (2013.01)

(58) Field of Classification Search
CPC ......... H01L 21/76837; H01L 21/30604; H01L 21/76802; H01L 21/78; H01L 23/5226; H01L 23/5389; H01L 24/05; H01L 2224/05571; H01L 21/76898; H01L 24/03; H01L 24/08; H01L 24/16; H01L 24/80; H01L 24/81; H01L 21/50; H01L 21/60

See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |

(Continued)

FOREIGN PATENT DOCUMENTS

TW    201919133 A    5/2019

*Primary Examiner* — Thanh T Nguyen
(74) *Attorney, Agent, or Firm* — Slater Matsil, LLP

(57) ABSTRACT

A method includes bonding an integrated circuit die to a carrier substrate, forming a gap-filling dielectric around the integrated circuit die and along the edge of the carrier substrate, performing a bevel clean process to remove portions of the gap-filling dielectric from the edge of the carrier substrate, after performing the bevel clean process, depositing a first bonding layer on the gap-filling dielectric and the integrated circuit die, forming a first dielectric layer on an outer sidewall of the first bonding layer, an outer sidewall of the gap-filling dielectric, and the first outer sidewall of the carrier substrate; and bonding a wafer to the first dielectric layer and the first bonding layer, wherein the wafer comprises a semiconductor substrate and a second dielectric layer on an outer sidewall of the semiconductor substrate.

20 Claims, 14 Drawing Sheets

(56) References Cited

U.S. PATENT DOCUMENTS

| | | | |
|---|---|---|---|
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 11,699,694 B2 | 7/2023 | Chen et al. | |
| 2010/0155932 A1* | 6/2010 | Gambino | H10D 88/00 257/713 |
| 2020/0321251 A1* | 10/2020 | Li | H01L 24/94 |
| 2021/0313309 A1* | 10/2021 | Chen | H01L 24/80 |
| 2021/0407942 A1* | 12/2021 | Yu | H01L 24/19 |
| 2022/0384212 A1* | 12/2022 | Chang | H01L 23/147 |
| 2023/0361068 A1* | 11/2023 | Sun | H01L 24/80 |
| 2024/0312836 A1* | 9/2024 | Chung | H01L 21/30604 |

\* cited by examiner

INTEGRATED CIRCUIT PACKAGES AND METHODS OF FORMING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
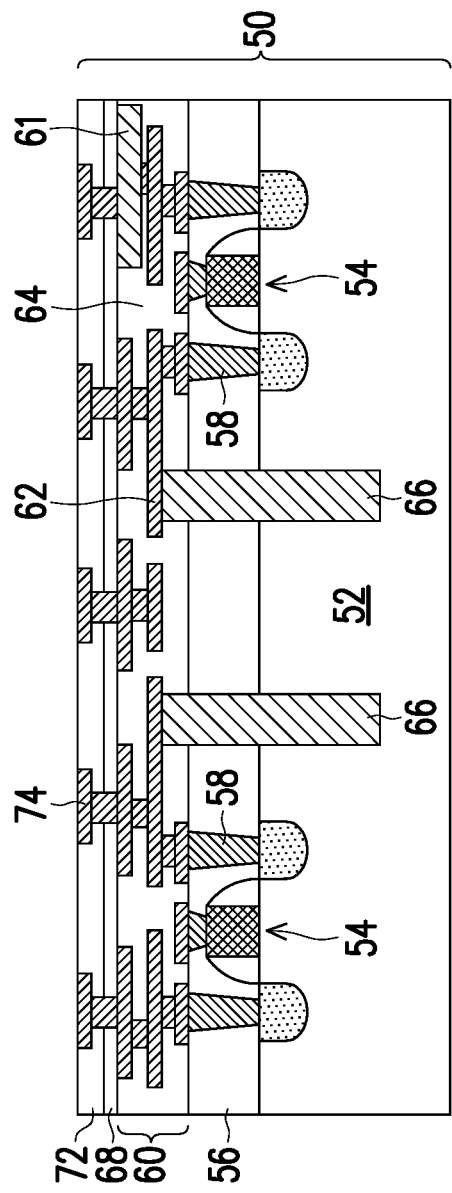
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to bonding one or more first semiconductor devices (e.g., top dies) to a second semiconductor device (e.g., a bottom wafer comprising a die) in order to provide a 3D integrated chip (3DIC) package. The one or more first semiconductor devices are first attached to a carrier substrate and then encapsulated in a first dielectric layer to form a wafer. A bevel clean process (e.g., an etch process) is performed to etch edge portions of the first dielectric layer. The bevel clean process also removes the first dielectric layer on edge portions of the carrier substrate and exposes sidewalls of the carrier substrate. An oxide layer is formed on the sidewalls of the wafer, and another oxide layer is formed on sidewalls of the second semiconductor device. The second semiconductor device is then bonded to a surface of the wafer using dielectric-to-dielectric bonds and metal-to-metal bonds, after which the carrier substrate is removed from the wafer. Advantageous features of one or more embodiments may include allowing for a reduction of the number of fabricating steps required to form the 3DIC package. This reduces the manufacturing cycle times, improves cost effectiveness, and reduces overall manufacturing costs. In addition, the formation of the oxide layers on the sidewalls of the wafer and on the sidewalls of the second semiconductor device allows for improved edge topographies of the wafer and the second semiconductor device. This results in improved bonding performance during the bonding of the wafer to the second semiconductor device.

FIG. 1 is a cross-sectional view of an integrated circuit die 50. The integrated circuit die 50 will be packaged in subsequent processing to form an integrated circuit device. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 (represented by a transistor) are disposed at the active surface of the semiconductor substrate 52. The devices 54 may be active devices (e.g., transistors, diodes, etc.), capacitors, resistors, etc. For example, the devices 54 may be transistors that include gate structures and source/drain regions, where the gate structures are on channel regions, and the source/drain regions are adjacent the channel regions. The channel regions may be patterned regions of the semiconductor substrate 52. For example, the channel regions may be regions of semiconductor fins, semiconductor nanosheets, semiconductor nanowires, or the like patterned in the semiconductor substrate 52. When the devices 54 are transistors, they may be nanostructure field-effect transistors (Nanostructure-FETs), fin field-effect transistors (FinFETs), planar transistors, or the like.

An inter-layer dielectric 56 is disposed over the active surface of the semiconductor substrate 52. The inter-layer dielectric 56 surrounds and may cover the devices 54. The inter-layer dielectric 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like, which may be formed by a deposition process such as chemical vapor deposition (CVD), atomic layer deposition (ALD), or the like. Contacts 58 extend through the inter-layer dielectric 56 to electrically and physically couple the devices 54. For example, when the devices 54 are transistors, the contacts 58 may couple the gates and source/drain regions of the transistors. The contacts 58 may be formed of a suitable conductive material such as tungsten, cobalt, nickel, copper, silver, gold, aluminum, the like, or combinations thereof, which may be formed by a deposition process such as physical vapor deposition (PVD) or CVD, a plating process such as electrolytic or electroless plating, or the like.

An interconnect structure 60 is disposed over the inter-layer dielectric 56 and the contacts 58. The interconnect structure 60 interconnects the devices 54 to form an integrated circuit. The interconnect structure 60 may be formed of, for example, metallization patterns 62 in dielectric layers 64. The dielectric layers 64 may be, e.g., low-k dielectric layers. The metallization patterns 62 include metal lines and vias, which may be formed in the dielectric layers 64 by a damascene process, such as a single damascene process, a dual damascene process, or the like. The metallization patterns 62 may be formed of a suitable conductive material, such as copper, tungsten, aluminum, silver, gold, a combination thereof, or the like. The metallization patterns 62 are electrically coupled to the devices 54 by the contacts 58. In some embodiments, a contact pad 61 may be formed in/on the interconnect structure 60, through which external connections are made to the interconnect structure 60 and the devices 54. The contact pad 61 may comprise copper, aluminum (e.g., 28K aluminum), or another conductive material. The contact pad 61 may not be separately illustrated in subsequent figures.

The conductive vias 66 extend into the interconnect structure 60 and/or the semiconductor substrate 52. The conductive vias 66 are electrically coupled to the metallization patterns 62 of the interconnect structure 60. The conductive vias 66 may be through-substrate vias, such as through-silicon vias. As an example to form the conductive vias 66, recesses can be formed in the interconnect structure 60 and/or the semiconductor substrate 52 by, for example, etching, milling, laser techniques, a combination thereof, or the like. A thin barrier layer may be conformally deposited in the recesses, such as by CVD, atomic layer deposition (ALD), physical vapor deposition (PVD), thermal oxidation, a combination thereof, or the like. The barrier layer may be formed from an oxide, a nitride, a carbide, combinations thereof, or the like. A conductive material may be deposited over the barrier layer and in the recesses. The conductive material may be formed by an electro-chemical plating process, CVD, ALD, PVD, a combination thereof, or the like. Examples of conductive materials include copper, tungsten, aluminum, silver, gold, a combination thereof, or the like. Excess conductive material and barrier layer is removed from a surface of the interconnect structure 60 or the semiconductor substrate 52 by, for example, a chemical-mechanical polish (CMP). The remaining portions of the barrier layer and conductive material in the recesses form the conductive vias 66.

In this embodiment, the conductive vias 66 are formed by a via-middle process, such that the conductive vias 66 extend through a portion of the interconnect structure 60 (e.g., a subset of the dielectric layers 64) and extend into the semiconductor substrate 52. The conductive vias 66 formed by a via-middle process are connected to a middle metallization pattern 62 of the interconnect structure 60. In another embodiment, the conductive vias 66 are formed by a via-first process, such that the conductive vias 66 extend into the semiconductor substrate 52 but not the interconnect structure 60. The conductive vias 66 formed by a via-first process are connected to a lower metallization pattern 62 of the interconnect structure 60. In yet another embodiment, the conductive vias 66 are formed by a via-last process, such that the conductive vias 66 extend through an entirety of the interconnect structure 60 (e.g., each of the dielectric layers 64) and extend into the semiconductor substrate 52. The conductive vias 66 formed by a via-last process are connected to an upper metallization pattern 62 of the interconnect structure 60.

One or more passivation layer(s) 68 are disposed on the interconnect structure 60. The passivation layer(s) 68 may be formed of one or more suitable dielectric materials such as silicon oxynitride, silicon nitride, low-k dielectrics such as carbon doped oxides, extremely low-k dielectrics such as porous carbon doped silicon oxide, a polymer such as polyimide, solder resist, polybenzoxazole (PBO), a benzocyclobutene (BCB) based polymer, molding compound, the like, or a combination thereof. The passivation layer(s) 68 may be formed by chemical vapor deposition (CVD), spin coating, lamination, the like, or a combination thereof. In some embodiments, the passivation layer(s) 68 include a silicon oxynitride layer or a silicon nitride layer.

A dielectric layer 72 is disposed on the passivation layer(s) 68. The dielectric layer 72 may be formed of an oxide such as silicon oxide, phosphosilicate glass (PSG), borosilicate glass (BSG), boron-doped phosphosilicate glass (BPSG), a tetraethyl orthosilicate (TEOS) based oxide, or the like; a nitride such as silicon nitride or the like; a polymer such as PBO, polyimide, a BCB-based polymer, or the like; a combination thereof; or the like. The dielectric layer 72 may be formed, for example, by CVD, spin coating, lamination, or the like.

Die connectors 74 extend through the dielectric layer 72 and the passivation layer(s) 68. The die connectors 74 may include conductive pillars, pads, or the like, to which external connections can be made. In some embodiments, the die connectors 74 include bond pads at the front-side surface of the integrated circuit die 50, and include bond pad vias that connect the bond pads to the upper metallization pattern 62 of the interconnect structure 60. In such embodiments, the die connectors 74 (including the bond pads and the bond pad vias) may be formed by a damascene process, such as a single damascene process, a dual damascene process, or the like. The die connectors 74 can be formed of a conductive material, such as a metal, such as copper, aluminum, or the like, which can be formed by, for example, plating, or the like.

Optionally, solder regions (not separately illustrated) may be disposed on the die connectors 74 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 74. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias (TSVs) such as through-silicon vias. Each of the semiconductor substrates 52 may (or may not) have a separate interconnect structure 60.

Figure 2:
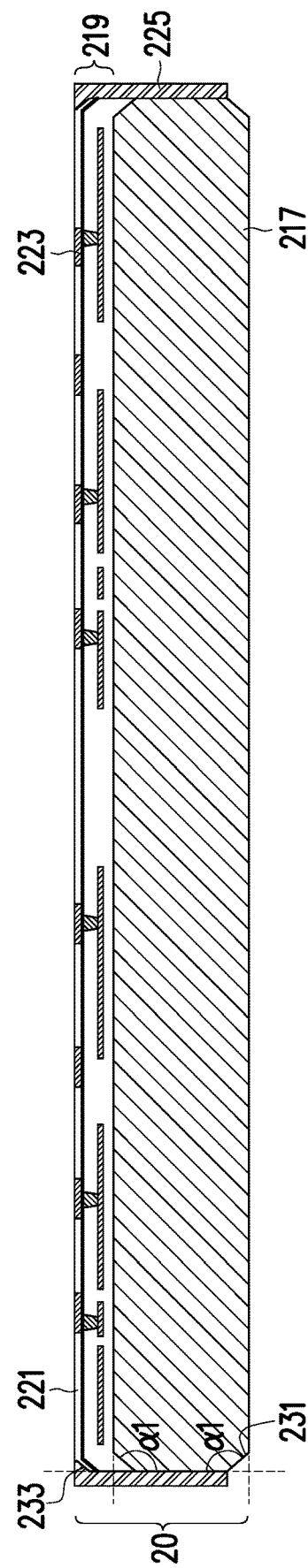
FIGS. 2-14 are cross-sectional views of intermediate stages in the manufacturing of integrated circuit packages, in accordance with some embodiments.

FIG. 2 illustrates a semiconductor wafer 20. The wafer 20 may comprise a die, which may also be subsequently referred to as a bottom die or a bottom wafer die. The wafer 20 may include a substrate 217 (e.g., a semiconductor substrate), an interconnect structure 219 disposed on the substrate 217, a bonding layer 221 disposed on the interconnect structure 219, and bonding pads 223 disposed in the bonding layer 221 and exposed at the front surface of the wafer 20.

The substrate 217 of the wafer 20 may include a crystalline silicon wafer. The substrate 217 may include various doped regions depending on design requirements (e.g., p-type substrate or n-type substrate). In some embodiments, the doped regions may be doped with p-type or n-type dopants. The doped regions may be doped with p-type dopants, such as boron or $BF_2$; n-type dopants, such as phosphorus or arsenic; and/or combinations thereof. The doped regions may be for n-type Fin-type Field Effect Transistors (FinFETs) and/or p-type FinFETs. In some alternative embodiments, the substrate 217 may comprise an active layer of a semiconductor-on-insulator (SOI) substrate. The substrate 217 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The edges of the substrate 217 include bevels (e.g., lower bevels 231 and upper bevels 233) which are surfaces that extend from the outermost sidewall of the substrate 217 to the top/bottom surfaces of the substrate 217, wherein the bevels have a slope from the outermost sidewall of the substrate 217, and wherein an angle αl between each bevel and the outermost sidewall of the substrate 217 is greater than 90° but smaller than 180°. In an embodiment, the outermost sidewall of the substrate 217 is disposed between a lower bevel 231 and a corresponding upper bevel 233.

Active and/or passive devices, such as transistors, diodes, capacitors, resistors, etc., may be formed in and/or on the substrate 217. The devices may be interconnected by the interconnect structure 219. The interconnect structure 219 electrically connects the devices on the substrate 217 to form one or more integrated circuits. The interconnect structure 219 may include one or more dielectric layers (for example, one or more interlayer dielectric (ILD) layers, intermetal dielectric (IMD) layers, or the like) and interconnect wirings or metallization patterns embedded in the one or more dielectric layers. The material of the one or more dielectric layers may include silicon oxide, silicon nitride, silicon oxynitride, or another suitable dielectric material. The interconnect wirings may include metallic wirings. For example, the interconnect wirings include copper wirings, copper pads, aluminum pads or combinations thereof that are formed by one or more single damascene processes, dual damascene processes, or the like.

The bonding layer 221 may comprise a dielectric layer. Bonding pads 223 are embedded in the bonding layer 221, and the bonding pads 223 allow connections to be made to the interconnect structure 219 and the devices on the substrate 217. The material of the bonding layer 221 may be silicon oxide, silicon nitride, silicon oxynitride, tetraethyl orthosilicate (TEOS), or other suitable dielectric material, and the bonding pads 223 may comprise conductive pads (e.g., copper pads), conductive vias (e.g., copper vias), or combinations thereof. The bonding layer 221 may be formed by depositing a dielectric material over the interconnect structure 219 using a chemical vapor deposition (CVD) process (e.g., a plasma enhanced CVD process or other suitable process). The bonding pads 223 may be formed by patterning the dielectric material with openings or through holes and then filling conductive material in the openings or through holes formed in the bonding layer 221 to form the bonding pads 223 embedded in the bonding layer 221.

Because the edges of the substrate 217 include bevels (e.g., the lower bevels 231 and the upper bevels 233), wherein each bevel has a slope from a vertical sidewall of the outermost sidewall of the substrate 217, the edges of the interconnect structure 219 and top surfaces of edges of the bonding layer 221 also include bevels that overlap the upper bevels 233 and are sloped. A dielectric layer 225 is formed on the sidewalls of the wafer 20, such as on the outermost sidewalls of the bonding layer 221, the interconnect structure 219, and the substrate 217, as well as on the bevels of the bonding layer 221. The dielectric layer 225 may overlap the beveled surfaces of the substrate 217. For example, top portions of the dielectric layer 225 may overlap the beveled surfaces of the substrate 217. The dielectric layer 225 may comprise silicon oxide, or the like, which may be deposited using a CVD process, ALD process, or the like. In an embodiment, a material of the dielectric layer 225 is different from a material of the bonding layer 221. In an embodiment, the dielectric layer 225 is not formed on the lower bevels 231. The dielectric layer 225 may be formed by depositing a dielectric material and then performing a planarization process, such as a CMP, etch-back, or the like, to remove excess portions of the dielectric material over a top surface of the wafer 20, such that top surfaces of the bonding layer 221 and the bonding pads 223 are exposed. The dielectric layer 225 comprises the remaining portions of the dielectric material on the sidewalls of the wafer 20 such as on the outermost sidewalls of the bonding layer 221, the interconnect structure 219, and the substrate 217, as well as on the bevels of the bonding layer 221 that overlap the upper bevels 233. In this way, the topmost surfaces of the bonding layer 221 and the bonding pads 223 are level with topmost surfaces of the dielectric layer 225. Advantages can be achieved by forming the dielectric layer 225 on the outermost sidewalls of the bonding layer 221, the interconnect structure 219, and the substrate 217, as well as on the bevels of the bonding layer 221 that overlap the upper bevels 233. In addition, the topmost surfaces of the bonding layer 221 and the bonding pads 223 are level with topmost surfaces of the dielectric layer 225. These advantages include improving an edge topography of the wafer 20 by allowing the topmost surfaces of the dielectric layer 225 that overlap the bevels of the bonding layer 221 to be level with top surfaces of the bonding pads 223 and top surfaces of the bonding layer 221 at a central portion of the wafer 20. This results in improved bonding performance during a subsequent process to bond the wafer 20 to a wafer 107 (described subsequently for FIG. 11).

FIGS. 3-14 are cross-sectional views of intermediate stages in the manufacturing of integrated circuit packages 100, in accordance with some embodiments. Specifically, integrated circuit packages 100 are formed by packaging multiple integrated circuit dies 50 in respective package regions 102P. The package regions 102P will be singulated along scribe line regions S1 (described subsequently for FIG. 13) in subsequent processing to form the integrated circuit packages 100. Processing of two package regions 102P is illustrated, but it should be appreciated that any number of package regions 102P can be simultaneously processed to form any number of integrated circuit packages 100.

Figure 3:
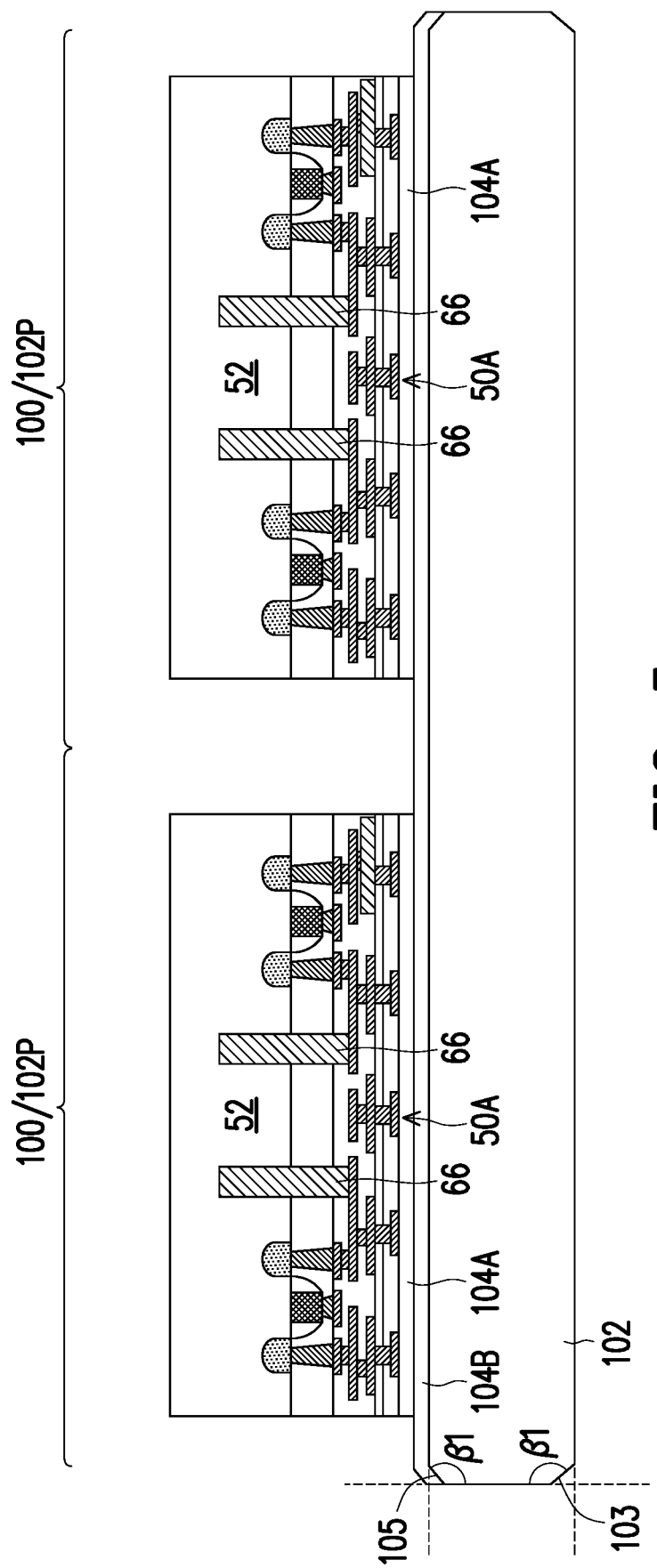

In FIG. 3, a carrier substrate 102 is provided. The carrier substrate 102 may be a semiconductor wafer (e.g., a crystalline silicon wafer), a glass carrier substrate, a ceramic carrier substrate, a silicon based carrier substrate (e.g., comprising silicon oxide), or the like. The carrier substrate 102 may be a wafer, such that multiple packages can be formed on the carrier substrate 102 simultaneously. The edges of the carrier substrate 102 include bevels (e.g., lower bevels 103 and upper bevels 105) which are surfaces that extend from the outermost sidewall of the carrier substrate 102 to the top/bottom surfaces of the carrier substrate 102, wherein the bevels have a slope from the outermost sidewall of the carrier substrate 102, and wherein an angle β1 between each bevel and the outermost sidewall of the carrier substrate 102 is greater than 90° but smaller than 180°. In an embodiment, the outermost sidewall of the carrier substrate 102 is disposed between a lower bevel 103 and a corresponding upper bevel 105.

Integrated circuit dies 50 (described previously in FIG. 1) are attached to the carrier substrate 102 in a face-down manner, such that the front-sides of the integrated circuit dies 50 are attached to the carrier substrate 102. In the illustrated embodiment, two integrated circuit dies 50 are attached to the carrier substrate 102, although any desired quantity of integrated circuit dies 50 may be attached to the carrier substrate 102.

The integrated circuit dies 50 are bonded to a surface of the carrier substrate 102 using a suitable technique such as dielectric-to-dielectric bonding, or the like. For example, in various embodiments, the integrated circuit dies 50 may be bonded to the carrier substrate 102 using dielectric-to-dielectric bonding by use of bonding layers 104A and a bonding layer 104B on the surfaces of the integrated circuit dies 50 and the carrier substrate 102, respectively. In some embodiments, the bonding layers 104A and bonding layer 104B may each comprise silicon oxide formed on the surfaces of the integrated circuit dies 50 and the carrier substrate 102, respectively by a deposition process, such as chemical vapor deposition (CVD), physical vapor deposition (PVD), or the like. In other embodiments, the bonding layer 104B may be formed by the thermal oxidation of a silicon surface on the carrier substrate 102. In alternative embodiments, the bonding layers 104A and the bonding layer 104B may comprise silicon oxynitride, silicon nitride, or the like. Because the edges of the carrier substrate 102 include bevels (e.g., the lower bevels 103 and the upper bevels 105), wherein each bevel has a slope from the outermost sidewall of the carrier substrate 102, the edges of the bonding layer 104B also include bevels that overlap the upper bevels 105 and are also sloped.

Prior to bonding, at least one of the bonding layers 104A or 104B may be subjected to a surface treatment. The surface treatment may include a plasma treatment. The plasma treatment may be performed in a vacuum environment. After the plasma treatment, the surface treatment may further include a cleaning process (e.g., a rinse with deionized water, or the like) that may be applied to the bonding layers 104A and/or bonding layer 104B. The integrated circuit dies 50 are then aligned and then placed by, e.g., a pick-and-place process. The integrated circuit dies 50 and the carrier substrate 102 are pressed against each other to initiate a pre-bonding of the integrated circuit dies 50 to the carrier substrate 102. The pre-bonding may be performed at room temperature (between about 20 degrees and about 25 degrees). The bonding time may be shorter than about 1 minute, for example. After the pre-bonding, the integrated circuit dies 50 and the carrier substrate 102 are bonded to each other. The bonding process may be strengthened by a subsequent annealing step. For example, this may be done by heating the integrated circuit dies 50 and the carrier substrate 102 to a temperature of about 170 degrees for about 1 hour.

In other embodiments, the bonding layers 104A/104B include a release layer, such as an epoxy-based thermal-release material, which loses its adhesive property when heated, such as a light-to-heat-conversion (LTHC) release coating; an ultra-violet (UV) glue, which loses its adhesive property when exposed to UV light; or the like. In other embodiments, the bonding layers 104A/104B include an adhesive, such as a suitable epoxy, a die attach film (DAF), or the like. The bonding layers 104A/104B may be applied to front-sides of the integrated circuit dies 50 and/or may be applied over the surface of the carrier substrate 102. In an embodiment, the bonding layers 104A/104B may be applied to the front-sides of the integrated circuit dies 50A before singulating to separate the integrated circuit dies 50A.

Figure 4:
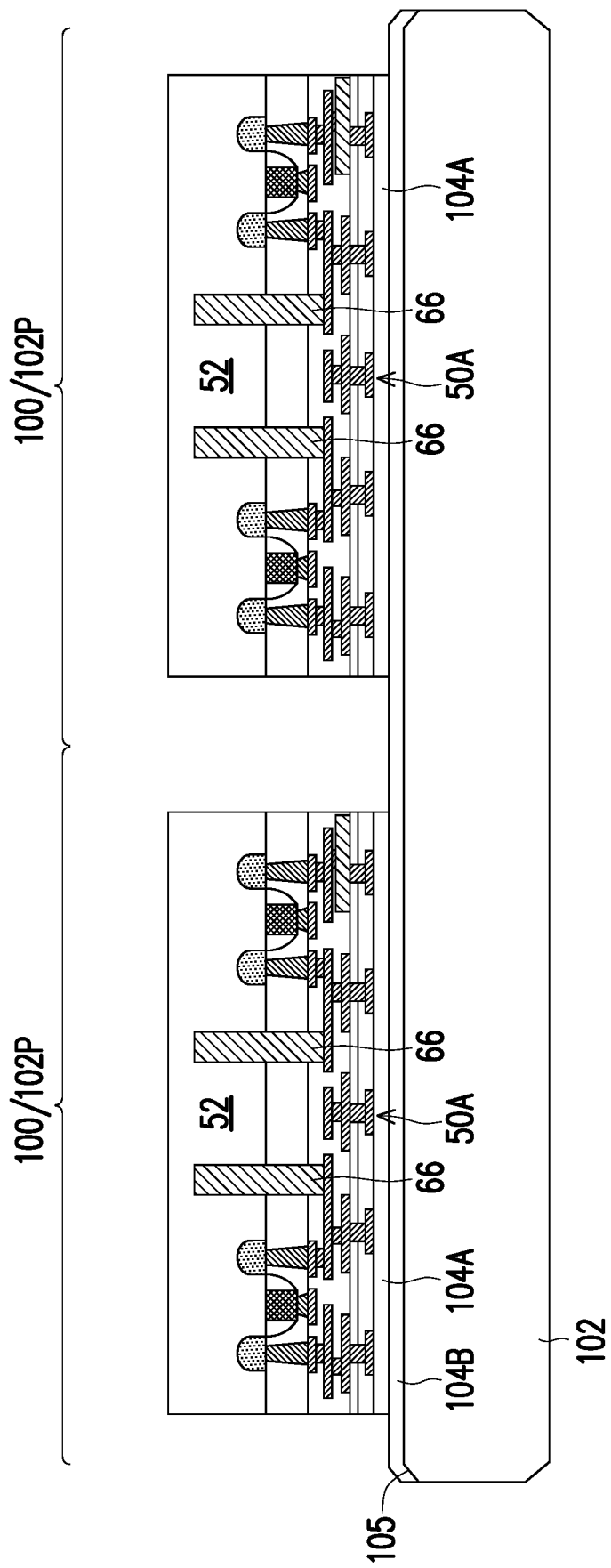

In FIG. 4, the semiconductor substrates 52 of the integrated circuit dies 50 are optionally thinned, which can help reduce the overall thickness of the integrated circuit packages 100. The thinning process may be, for example, a chemical-mechanical polish (CMP), a grinding process, an etch-back process, or the like, which is performed at the back-side of the integrated circuit dies 50. The thinning process reduces the thickness of the semiconductor substrates 52. The conductive vias 66 of the integrated circuit dies 50 remain buried by the respective semiconductor substrates 52 after this step of thinning. Thinning the semiconductor substrates 52 at this step of processing can help reduce the costs of exposing the conductive vias 66 in subsequent processing steps.

Figure 5:
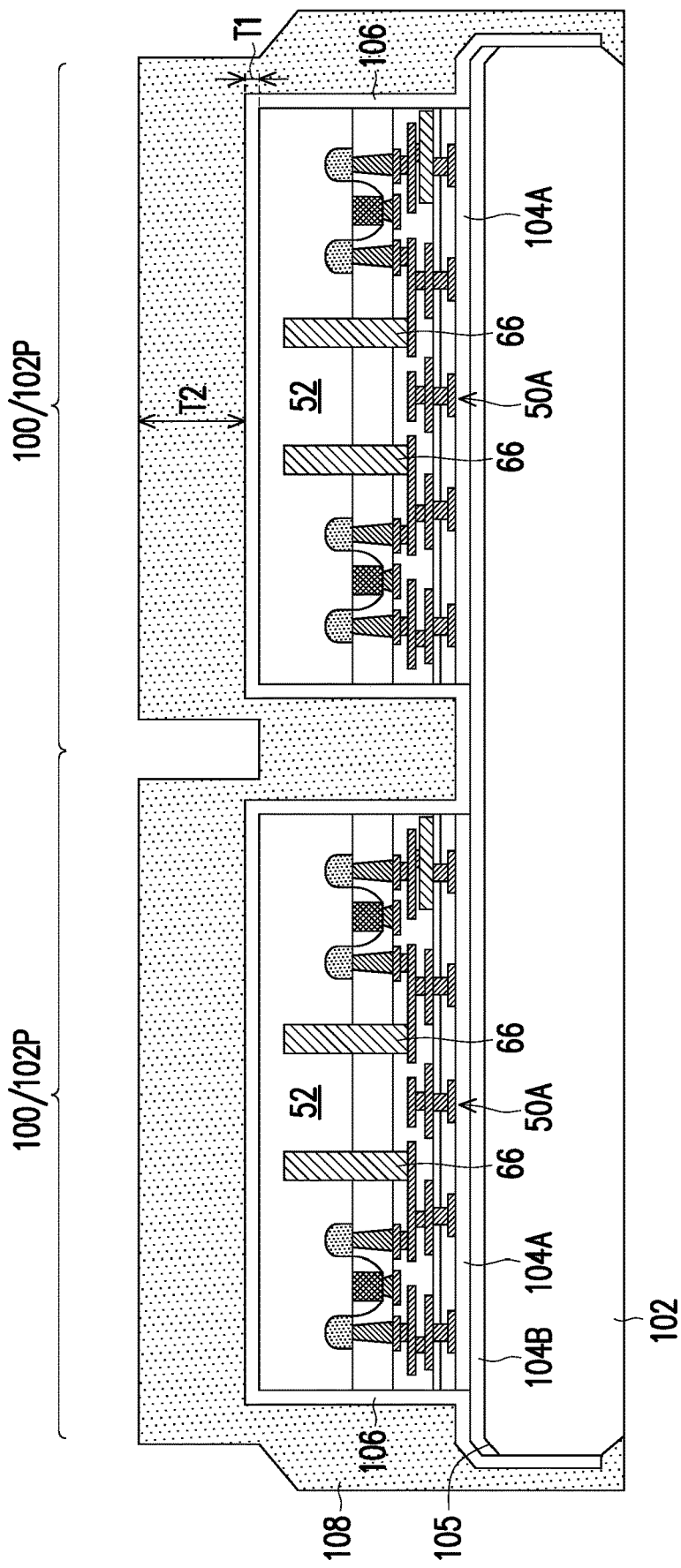

In FIG. 5, a liner 106 is formed over the integrated circuit dies 50, and the carrier substrate 102, such as over back-side surfaces of the integrated circuit dies 50 and the top surface of the bonding layer 104B, on the bevels of the bonding layer 104B, as well as on sidewalls of the integrated circuit dies 50 and the carrier substrate 102. In an embodiment, the liner 106 is not deposited on the lower bevels 103 of the carrier substrate 102. The liner 106 may comprise a tetraethyl orthosilicate (TEOS) based oxide, silicon nitride, SiON, SiCN, SiC, TiN, Ti, or the like, and may be formed using a suitable deposition process such as chemical vapor deposition (CVD), atomic layer deposition (ALD), or the like. In an embodiment, the dielectric layer may have a thickness T1 that is in a range from 0.01 μm to 2 μm.

After forming the liner 106, a gap-filling dielectric 108 is formed over the liner 106 and between the integrated circuit dies 50, so as to encapsulate each of the integrated circuit dies 50. Initially, the gap-filling dielectric 108 may bury or cover the integrated circuit dies 50A, such that a top surface of the gap-filling dielectric 108 is above the back-side surfaces of the integrated circuit dies 50 and the liner 106. The gap-filling dielectric 108 is disposed over the portions of the carrier substrate 102 between the integrated circuit dies 50, and contacts a top surface of liner 106 between the integrated circuit dies 50. The gap-filling dielectric 108 fills (and may overfill) the gaps between the integrated circuit dies 50. The gap-filling dielectric 108 may also encapsulate the carrier substrate 102, such that the gap-filling dielectric 108 is also disposed over the edges of the carrier substrate 102 (e.g., including the lower bevels 103, the upper bevels 105, and the sidewalls of the carrier substrate 102). The gap-filling dielectric 108 may be in physical contact with the lower bevels 103. The gap-filling dielectric 108 may be formed of a dielectric material, such as an oxide such as silicon oxide, a tetraethyl orthosilicate (TEOS) based oxide, SOG, or the like, which may be formed by a suitable deposition process such as chemical vapor deposition (CVD), atomic layer deposition (ALD), or the like. In an embodiment, the gap-filling dielectric 108 over the back-side surfaces of the integrated circuit dies 50 may have a thickness T2 that is in a range from 5 μm to 50 μm. The thickness T2 may be larger than the thickness T1 of the liner 106. Because the edges of the carrier substrate 102 include bevels (e.g., the lower bevels 103 and the upper bevels 105), wherein each bevel has a slope from the outermost sidewall of the carrier substrate 102, the edges of the bonding layer 104B, the edges of the liner 106, and the edges of the gap-filling dielectric 108 also include bevels that overlap the upper bevels 105 and are sloped.

Figure 6:
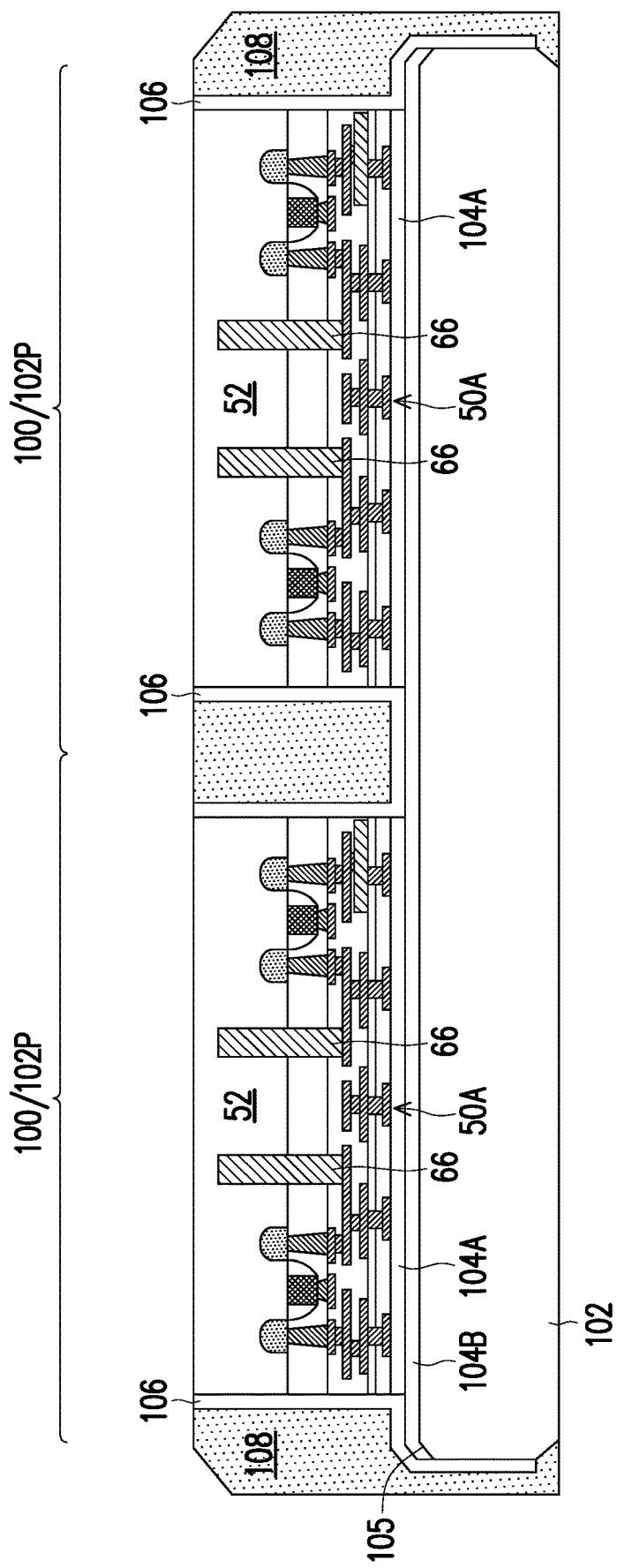

In FIG. 6, a removal process is performed to level surfaces of the gap-filling dielectric 108 with the back-side surfaces of the integrated circuit dies 50. In some embodiments, a planarization process such as a chemical mechanical polish (CMP), an etch-back process, combinations thereof, or the like is utilized. After the planarization process, top surfaces of the gap-filling dielectric 108, top surfaces of the liner 106, and the back-side surfaces of the integrated circuit dies 50 are substantially coplanar (within process variations). The conductive vias 66 may remain buried by the semiconductor substrates 52 after the removal process.

Figure 7:
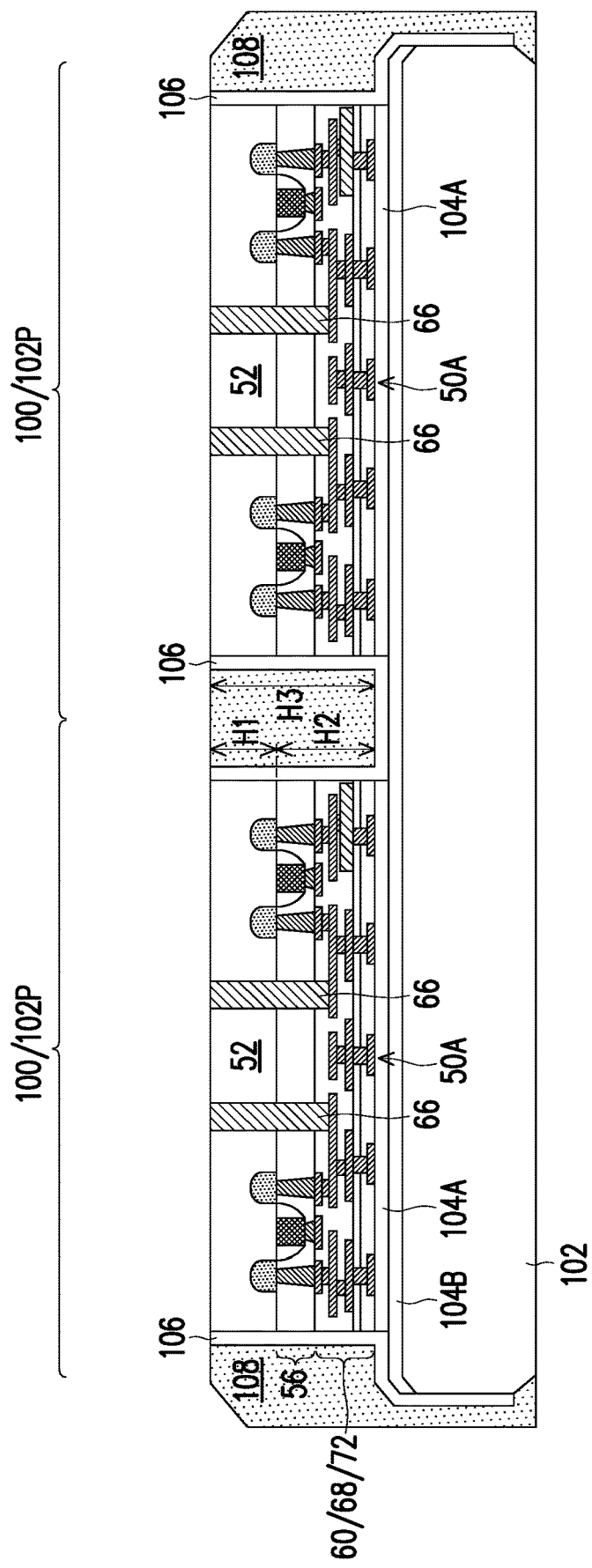

In FIG. 7, the semiconductor substrates 52 are thinned to expose the conductive vias 66. Portions of the gap-filling dielectric 108 and portions of the liner 106 may also be removed by the thinning process. The thinning process may be, for example, a chemical-mechanical polish (CMP), a grinding process, an etch-back process, or the like, which is performed at the back-side of the integrated circuit dies 50. In some embodiments, the thinning process utilized to expose the conductive vias 66 is performed at a slower removal rate than the thinning process previously utilized to thin the semiconductor substrates 52 (described for FIG. 4). Exposing the conductive vias 66 at a slow removal rate can help avoid overgrinding that may damage the conductive vias 66. In an embodiment, after the thinning of the semiconductor substrates 52, each semiconductor substrate 52 may have a height H1 that is in a range from 3 μm to 15 μm. In an embodiment, the interconnect structure 60, the passivation layer(s) 68, and the dielectric layer 72 of each integrated circuit die 50 may have a combined height H2 that is in a range from 1 μm to 15 μm. In an embodiment, each integrated circuit die 50 may have a height H3 that is in a range from 3 μm to 40 μm. In an embodiment, after the thinning process, the edges of the gap-filling dielectric 108 still include bevels that overlap the upper bevels 105 of the carrier substrate 102. In another embodiment, the thinning process removes bevels of the gap-filling dielectric 108.

Figure 8:
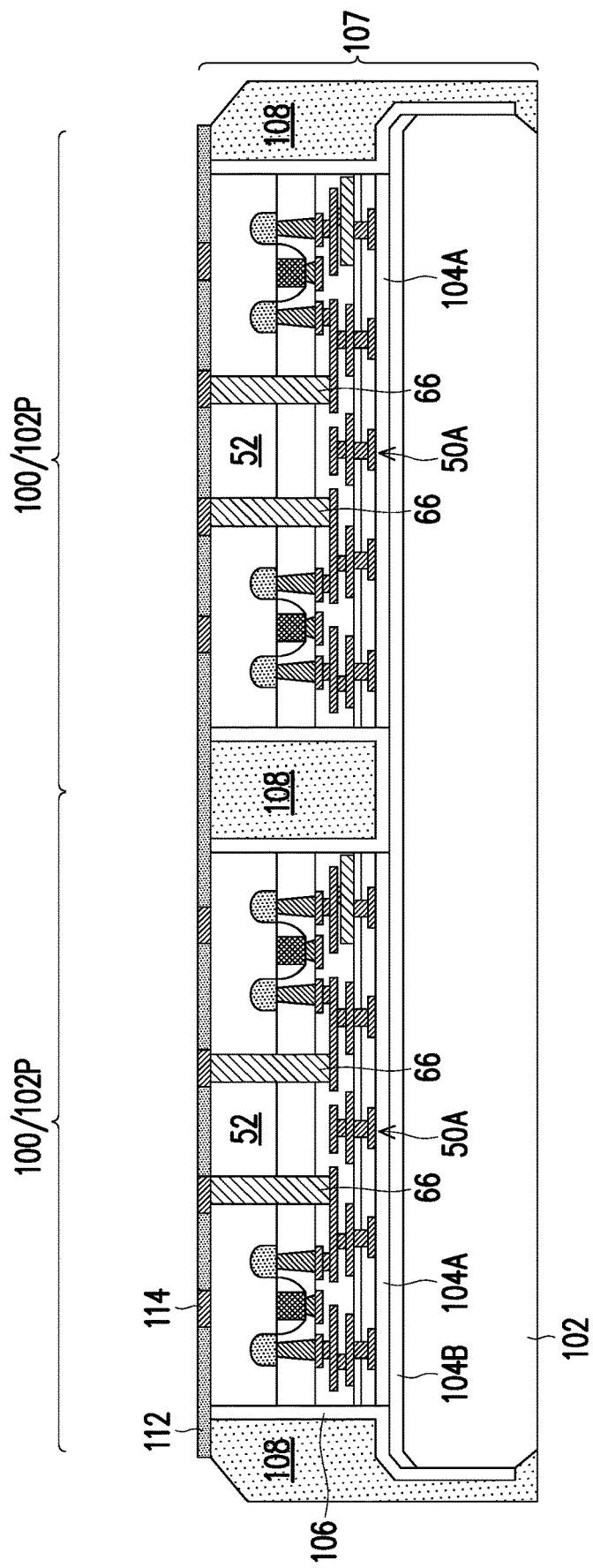

In FIG. 8, a bonding layer 112 is formed over the structure shown in FIG. 7 to form a wafer 107. The bonding layer 112 may be formed to be in physical contact with the back-side surfaces of the integrated circuit dies 50 (including the conductive vias 66), the liner 106, and the gap-filling dielectric 108. The bonding layer 112 may comprise any dielectric material that is capable of forming a dielectric-to-dielectric bond. For example the bonding layer 112 may comprise silicon oxide (e.g., $SiO_2$), silicon oxynitride, silicon nitride, or the like, formed using a suitable deposition process such as chemical vapor deposition (CVD), atomic layer deposition (ALD), or the like. Conductive connectors 114 may then be formed that extend through the bonding layer 112. The conductive connectors 114 may be formed using a damascene process, or the like. Openings are first formed that extend through the bonding layer 112 and expose top surfaces of the conductive vias 66. The openings may be formed using acceptable photolithography and etching techniques, such as by forming and patterning a photoresist and then performing an etching process using the patterned photoresist as an etching mask. The etching process may include, for example, a dry etching process and/or a wet etching process. During the formation of the openings, edge portions of the bonding layer 112 that are disposed over the bevels of the gap-filling dielectric 108 may also be removed. A conductive material (e.g., copper, a copper alloy, gold, aluminum, or the like) may then be formed in the openings, thereby forming the conductive connectors 114, in accordance with some embodiments. A planarization process (e.g., a CMP process or a grinding process) may be performed to remove excess conductive material along the top surface of the bonding layer 112, such that top surfaces of the conductive connectors 114 and the bonding layer 112 are level.

Figure 9:
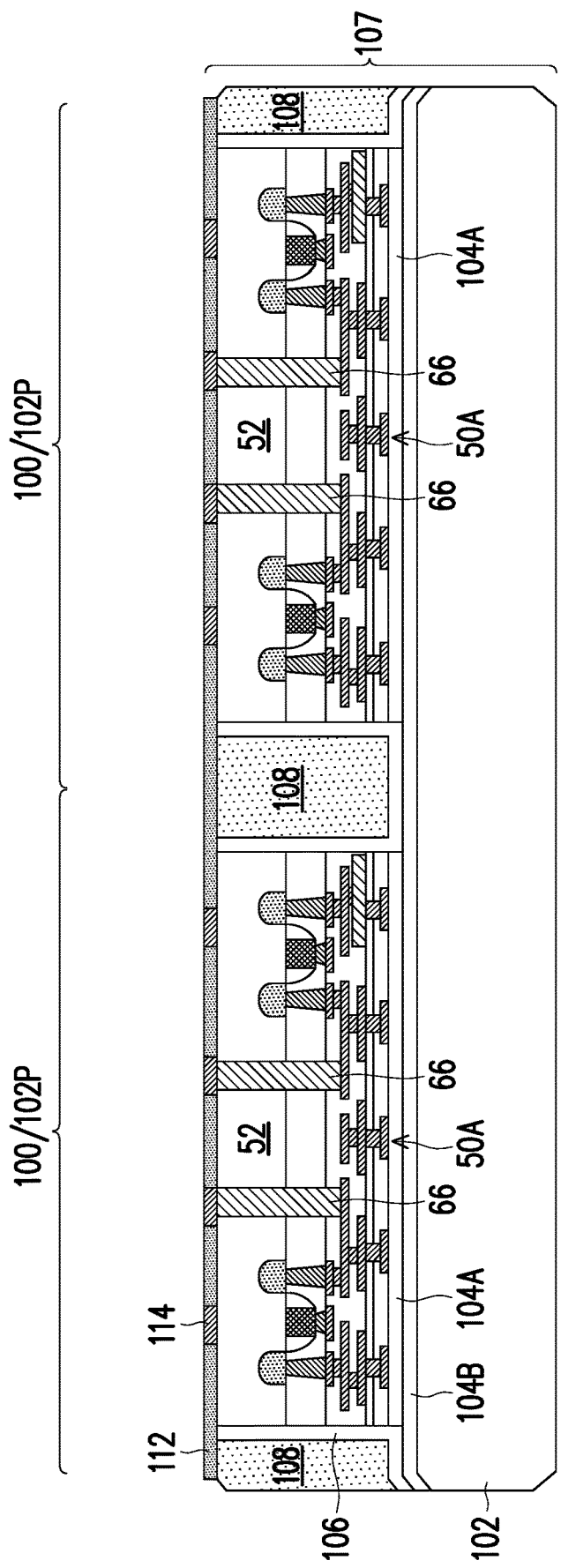

In FIG. 9, a bevel cleaning process is performed to remove portions of the liner 106 and the gap-filling dielectric 108 from edges of the wafer 107. For example, during the bevel cleaning process, the liner 106 and the gap-filling dielectric 108 are removed from the outermost sidewalls of the carrier substrate 102 and the bonding layer 104B. The gap-filling dielectric 108 is also removed from the lower bevels 103. Further, after the bevel cleaning process, an outermost sidewall of the gap-filling dielectric 108, an outermost sidewall of the bonding layer 104B, and an outermost sidewall of the carrier substrate 102 may be coterminous with each other. The bevel cleaning process may comprise a wet etch process using dilute hydrofluoric acid as an etchant. In an embodiment, after the bevel cleaning process, the edges of the gap-filling dielectric 108 still include bevels that overlap the upper bevels 105 of the carrier substrate 102. In another embodiment, the bevel cleaning process removes bevels of the gap-filling dielectric 108.

Figure 10:
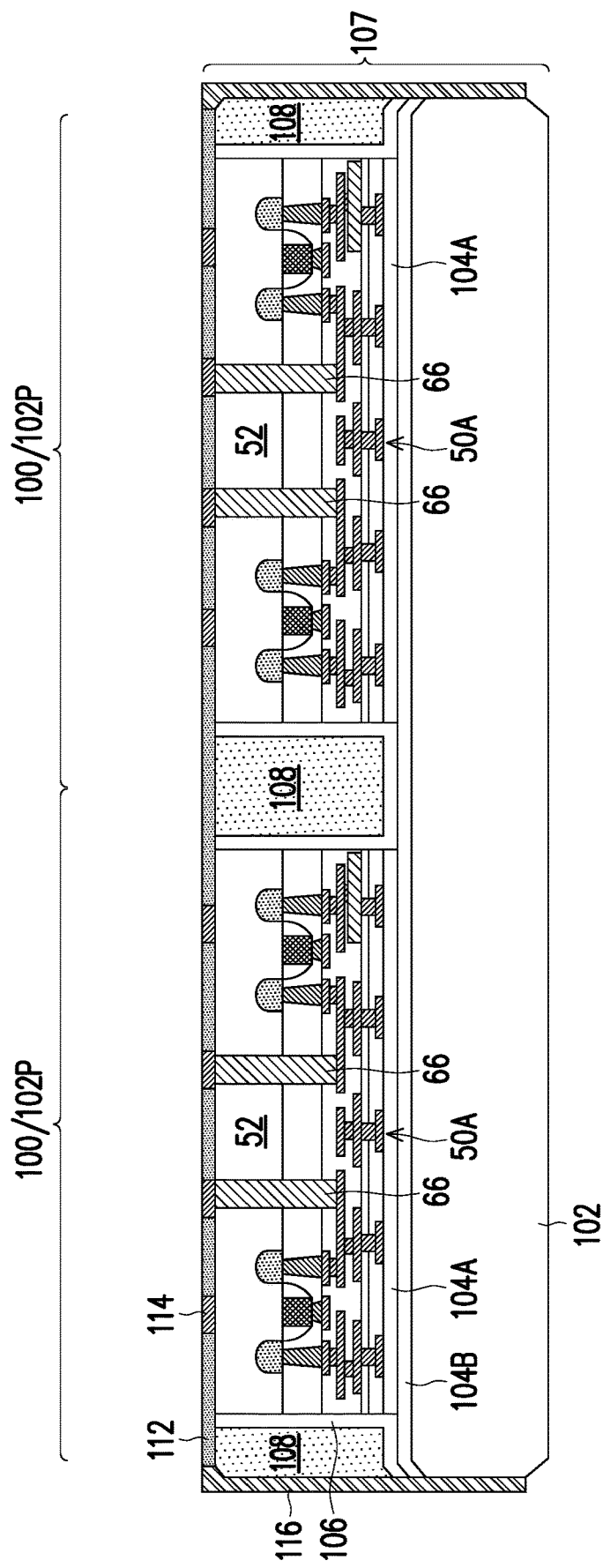

In FIG. 10, a dielectric layer 116 is formed on the sidewalls of the wafer 107, such as on the outermost sidewalls of the bonding layer 112, the outermost sidewalls and bevels (if present) of the gap-filling dielectric 108, the outermost sidewalls of the liner 106, the outermost sidewalls of the bonding layer 104B, and the outermost sidewalls of the carrier substrate 102. The dielectric layer 116 may comprise silicon oxide, or the like, which may be deposited using a CVD process, ALD process, or the like. In an embodiment, a material of the dielectric layer 116 is different from a material of the bonding layer 112. In an embodiment, the dielectric layer 116 is not formed on the lower bevels 103. The dielectric layer 116 may be formed by depositing a dielectric material and then performing a planarization process, such as a CMP, etch-back, or the like, to remove excess portions of the dielectric material over top surfaces of the bonding layer 112 and the conductive connectors 114. Accordingly, the top surfaces of the bonding layer 112 and the conductive connectors 114 are exposed. The dielectric layer 116 comprises the remaining portions of the dielectric the sidewalls of the wafer 107, such as on the outermost sidewalls of the bonding layer 112, the outermost sidewalls of the liner 106, the outermost sidewalls of the bonding layer 104B, the outermost sidewalls of the carrier substrate 102, the outermost sidewalls of the gap-filling dielectric 108, as well as on the bevels of the gap-filling dielectric 108 that overlap the upper bevels 105. For example, top portions of the dielectric layer 116 contact the beveled surfaces of the gap-filling dielectric. In this way topmost surfaces of the bonding layer 112 and the conductive connectors 114 are level with topmost surfaces of the top portions of the dielectric layer 116.

In some embodiments, the dielectric layer 116 is disposed on the outermost sidewalls of the bonding layer 112, the liner 106, the bonding layer 104B, the carrier substrate 102, the gap-filling dielectric 108, and over the bevels of the gap-filling dielectric 108 that overlap the upper bevels 105. Further, the topmost surfaces of the bonding layer 112 and the conductive connectors 114 are level with topmost surfaces of the dielectric layer 116. Advantages can be achieved by performing the bevel cleaning process to remove portions of the liner 106 and the gap-filling dielectric 108 from edges of the wafer 107, wherein the liner 106 and the gap-filling dielectric 108 are removed from the outermost sidewalls of the carrier substrate 102 and the bonding layer 104B. In addition, after the bevel cleaning process, an outermost sidewall of the gap-filling dielectric 108, an outermost sidewall of the bonding layer 104B, and an outermost sidewall of the carrier substrate 102 are coterminous with each other. The advantages include improving an edge topography of the wafer 107 by allowing the topmost surfaces of the dielectric layer 116 that overlap bevels of the gap-filling dielectric 108 to be level with top surfaces of the conductive connectors 114 and top surfaces of the bonding layer 112 at a central portion of the wafer 107. This results in improved bonding performance during a subsequent process to bond the wafer 20 to the wafer 107 (described subsequently for FIG. 11).

Figure 11:
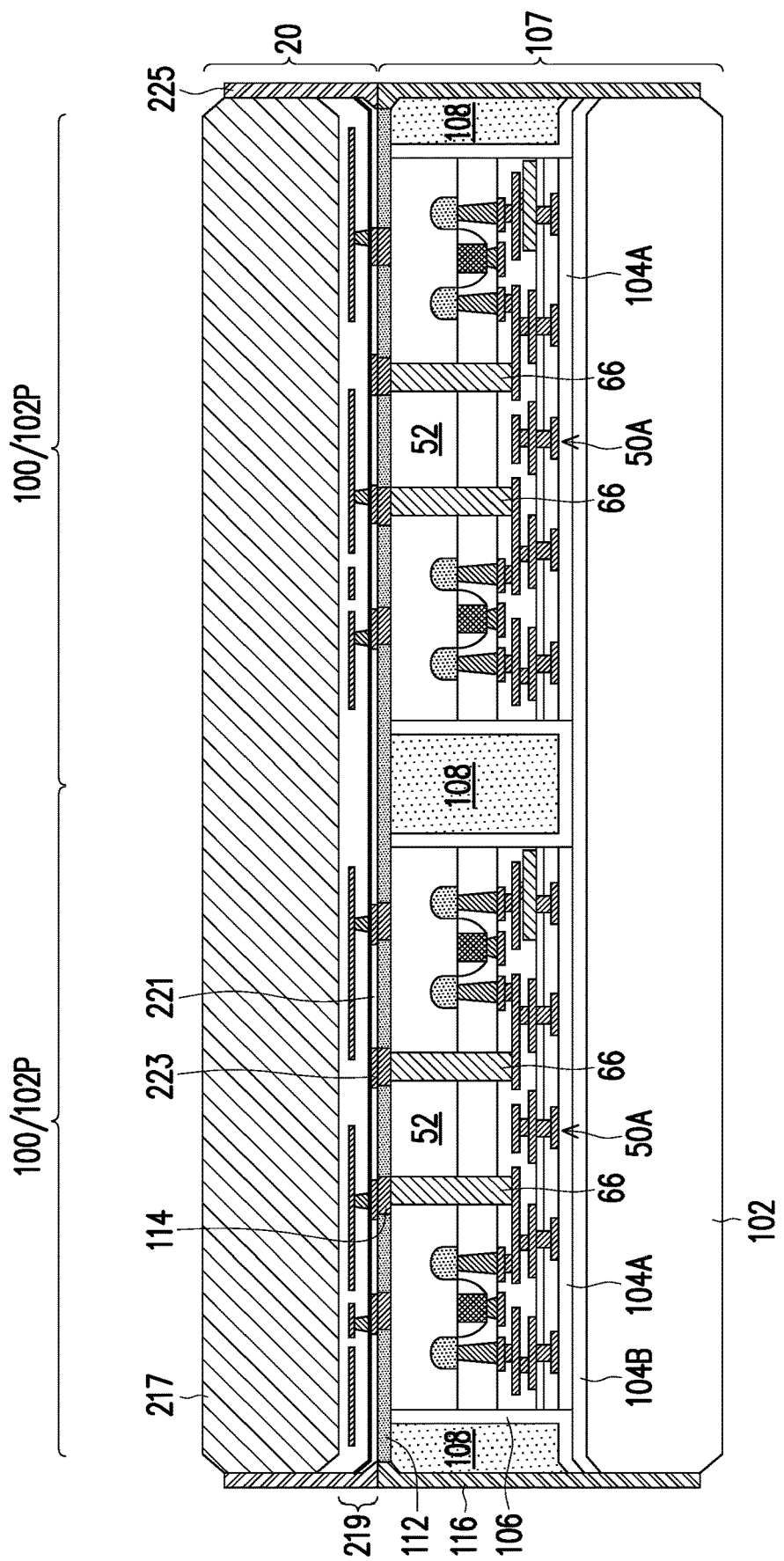

In FIG. 11, the wafer 107 is bonded to the wafer 20 (described previously in FIG. 2). The bonding is carried out such that the front-side of the wafer 20 are attached to the back-sides of the integrated circuit dies 50 (through the bonding layer 221), such that the front-side of the wafer 20 faces the back-sides of the integrated circuit dies 50. In some embodiments, the wafer 107 is bonded to the wafer 20 by dielectric-to-dielectric bonding and/or metal-to-metal bonding. In such embodiments, covalent bonds may be formed between oxide layers, such as the bonding layer 112 of the wafer 107 and the bonding layer 221 of the wafer 20. Further covalent bonds may be formed between other oxide layers, such as the dielectric layer 225 of the wafer 20 and the dielectric layer 116 of the wafer 107. During the bonding, metal bonding may also occur between the conductive connectors 114 of the wafer 107 and the bonding pads 223 of the wafer 20.

In some embodiments, before performing the bonding process, a surface treatment is performed on the wafer 20 and/or the wafer 107. In some embodiments, the top surfaces of the dielectric layer 116 and the bonding layer 112 and/or the dielectric layer 225 and the bonding layer 221 may first be activated utilizing, for example, a dry treatment, a wet treatment, a plasma treatment, exposure to an inert gas, exposure to $H_2$, exposure to $N_2$, exposure to $O_2$, the like, or combinations thereof. However, any suitable activation process may be utilized. After the activation process, the dielectric layer 116 and the bonding layer 112 and/or the dielectric layer 225 and the bonding layer 221 may be cleaned using, e.g., a chemical rinse. The wafer 20 is then aligned with the wafer 107 and the two are placed in physical contact. The wafer 20 may be placed on the wafer 107 using a pick-and-place process, for example. An example bonding process includes directly bonding the bonding layer 112 of the wafer 107 and the bonding layer 221 of the wafer 20 through fusion bonding. In addition, the bonding process includes directly bonding the dielectric layer 116 of the wafer 107 and the dielectric layer 225 of the wafer 20 through fusion bonding. In an embodiment, the bond between the bonding layer 112 of the wafer 107 and the bonding layer 221 of the wafer 20 may be an oxide-to-oxide bond. The bond between the dielectric layer 116 of the wafer 107 and the dielectric layer 225 of the wafer 20 may be an oxide-to-oxide bond. The bonding process also directly bonds the conductive connectors 114 of the wafer 107 and the bonding pads 223 of the wafer 20 through direct metal-to-metal bonding. Thus, the wafer 107 and the wafer 20 are electrically connected. This process starts with aligning the bonding pads 223 and the conductive connectors 114, such that the bonding pads 223 overlap with corresponding conductive connectors 114. Next, a pre-bonding step is performed, during which the wafer 20 is put in contact with the wafer 107. The bonding process continues with performing an anneal, for example, at a temperature between about 100° C. and about 450° C. for a duration between about 0.5 hours and about 3 hours, so that the metal in the bonding pads 223 and the conductive connectors 114 inter-diffuses to each other, and hence direct metal-to-metal bonds are formed.

Advantages can be achieved as a result of forming the integrated circuit package 100 by bonding the wafer 107 to the wafer 20 using a bonding process that includes directly bonding the bonding layer 112 of the wafer 107 and the bonding layer 221 of the wafer 20 through fusion bonding. The bonding process also includes directly bonding the dielectric layer 116 of the wafer 107 and the dielectric layer 225 of the wafer 20 through fusion bonding. In addition, the bonding process includes directly bonding the conductive connectors 114 of the wafer 107 and the bonding pads 223 of the wafer 20 through direct metal-to-metal bonding. These advantages include allowing for a reduction of the number of fabricating steps required to form the integrated circuit package 100. This reduces the manufacturing cycle times, improves cost effectiveness, and reduces overall manufacturing costs.

Figure 12:
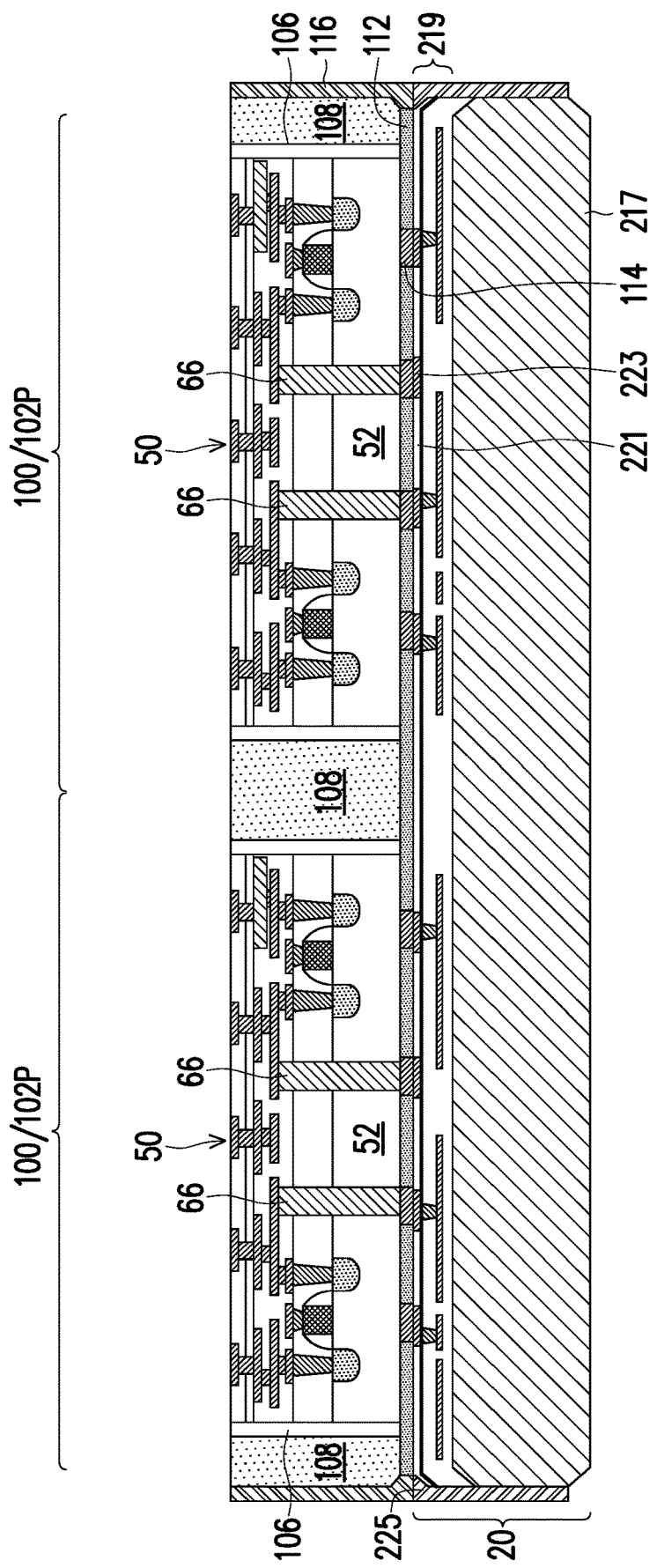

In FIG. 12, the structure shown in FIG. 11 is flipped over and placed on a tape (not separately illustrated). The carrier substrate 102, the bonding layer 104A, the bonding layer 104B, portions of the liner 106, and portions of the dielectric layer 116, are removed with a suitable removal process, such as with a planarization process (e.g., a CMP or grinding process), an etching process, or the like. After the planarization process, the front-side surfaces of the integrated circuit dies 50 (e.g., the dielectric layer 72 and the die connectors 74) are exposed. In an embodiment, after the planarization process, top surfaces of the dielectric layer 72, the die connectors 74, the dielectric layer 116, and the gap-filling dielectric 108 are substantially coplanar (within process variations).

Figure 13:
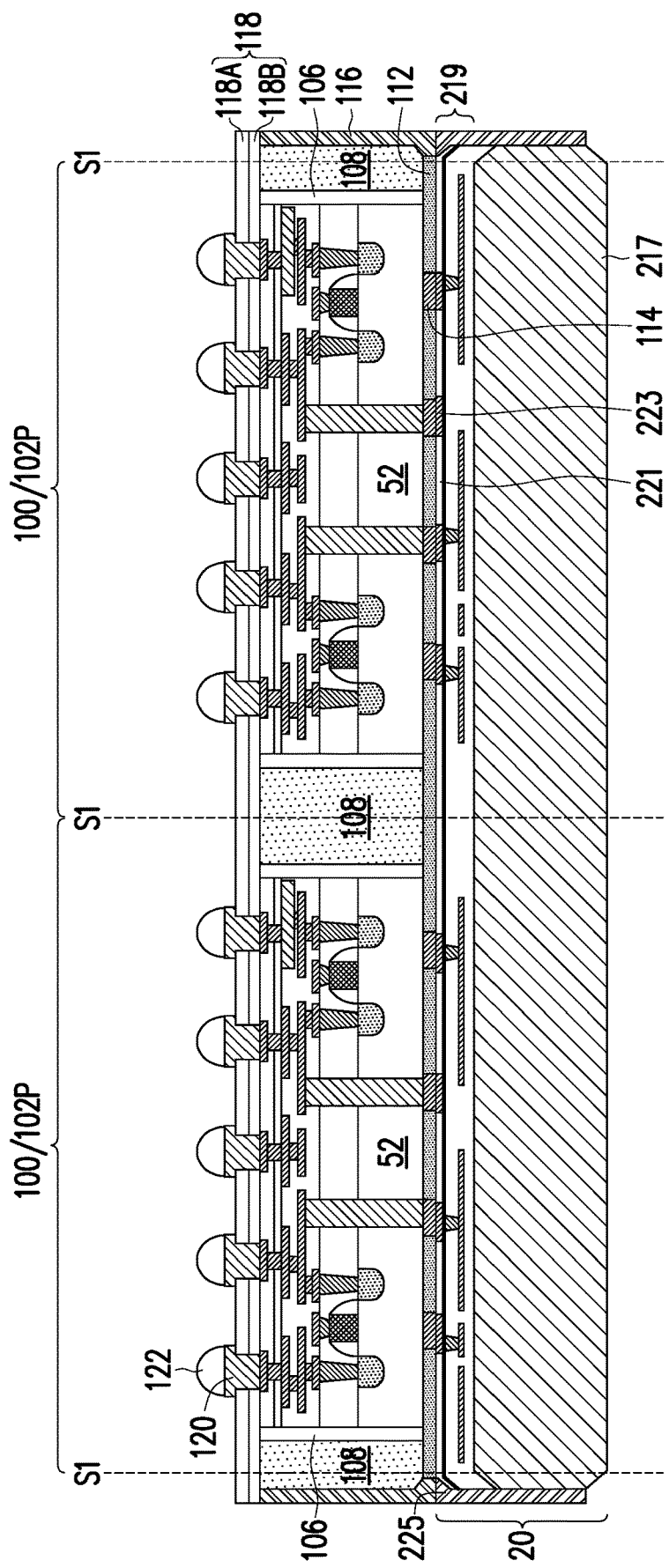

In FIG. 13, additional features for attaching additional components to the structure shown in FIG. 12 are formed. In some embodiments, one or more passivation layer(s) 118 (e.g., passivation layer 118A and passivation layer 118B), die connectors 120, and conductive connectors 122 are formed. The conductive connectors 122 may be used to electrically connect the integrated circuit dies 50 and the wafer 20 to the additional components through the die connectors 120, the interconnect structure 60, the die connectors 74, the conductive vias 66, the bonding pads 223, and the interconnect structure 219. The passivation layer(s) 118, the die connectors 120, and the conductive connectors 122 may be formed before or after a singulation process (described subsequently for FIG. 14) is performed to form individual integrated circuit packages 100.

The passivation layer(s) 118 may be formed over the front-side surfaces of the integrated circuit dies 50, the gap-filling dielectric 108, the liner 106, and the dielectric layer 116 that were exposed by removal of the carrier substrate 102 (see FIG. 12). The passivation layer(s) 118 may be formed of one or more suitable dielectric materials such as silicon oxynitride, silicon nitride, low-k dielectrics such as carbon doped oxides, extremely low-k dielectrics such as porous carbon doped silicon oxide, or the like; a polymer such as polyimide, solder resist, polybenzoxazole (PBO), a benzocyclobutene (BCB) based polymer, molding compound, or the like; a combination thereof; or the like. The passivation layer(s) 118 may be formed by chemical vapor deposition (CVD), spin coating, lamination, the like, or a combination thereof.

The die connectors 120 may be formed through the passivation layer(s) 118 of the integrated circuit dies 50 to contact the die connectors 74 of the integrated circuit dies 50. The die connectors 120 may include conductive pillars, pads, or the like, to which external connections can be made. The die connectors 120 can be formed of a conductive material, such as a metal, such as copper, aluminum, or the like, which can be formed by, for example, plating, or the like. As an example to form the die connectors 120, the passivation layer(s) 118 are patterned utilizing photolithography and etching techniques to form openings corresponding to the desired pattern of the die connectors 120. The openings may then be filled with a conductive material (previously described) to form the die connectors 120 in the openings.

The conductive connectors 122 may be formed on the die connectors 120. The conductive connectors 122 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 122 may include a conductive material such as solder, copper, aluminum, gold, nickel, silver, palladium, tin, the like, or a combination thereof. In some embodiments, the conductive connectors 122 are formed by initially forming a layer of a reflowable material (e.g., solder) through evaporation, electroplating, printing, solder transfer, ball placement, or the like. Once a layer of solder has been formed on the structure, a reflow may be performed in order to shape the material into the desired bump shapes.

Figure 14:
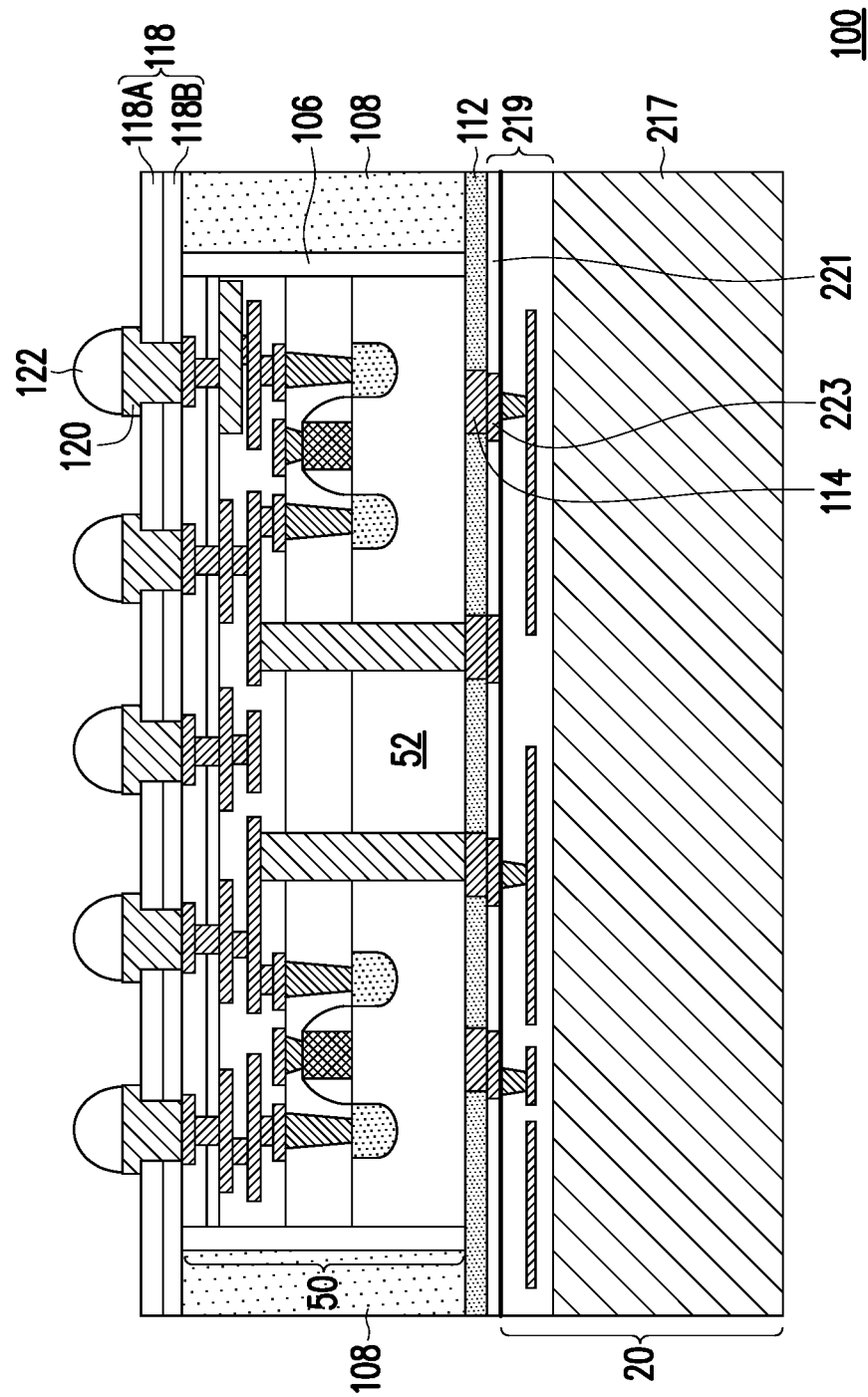

In FIG. 14, a singulation process is performed to singulate the package regions 102P (shown in FIG. 13) from one another. The singulation process may include a mechanical process such as a sawing process, a cutting process, or the like. In some embodiments, the singulation process may include an etching process, lasering process, mechanical process, and/or combinations thereof. The singulation is performed along the scribe line regions S1 (shown in FIG. 13) between the package regions 102P. The resulting, singulated integrated circuit package 100 is from one of the package regions 102P. After the singulation process, the singulated portions of the passivation layer(s) 118, the gap-filling dielectric 108, the bonding layer 112, the bonding layer 221, the interconnect structure 219, and the substrate 217 are laterally coterminous.

Forming the dielectric layer 225 on the outermost sidewalls and the bevels of the wafer 20 (see FIG. 2) may be advantageous. Forming a dielectric layer 116 on the outermost sidewalls and bevels (if present) of the wafer 107 (see FIG. 10) may also be advantageous. These advantages include improving an edge topography of the wafer 20 and the wafer 107 by allowing a central portion of the wafer 20 to be level with topmost surfaces of the dielectric layer 225 that overlap the bevels of the wafer 20, and in addition, allowing a central portion of the wafer 107 to be level with topmost surfaces of the dielectric layer 116 that overlap the bevels of the wafer 107. This results in improved bonding performance during a process to bond the wafer 20 to the wafer 107. Further advantages may be achieved by forming the integrated circuit package 100 by bonding the wafer 107 to the wafer 20 (see FIG. 11) using a bonding process that includes directly bonding the bonding layer 112 of the wafer 107 and the bonding layer 221 of the wafer 20 through fusion bonding. The bonding process also includes directly bonding the dielectric layer 116 of the wafer 107 and the dielectric layer 225 of the wafer 20 through fusion bonding. In addition, the bonding process includes directly bonding the conductive connectors 114 of the wafer 107 and the bonding pads 223 of the wafer 20 through direct metal-to-metal bonding. These advantages include allowing for a reduction of the number of fabricating steps required to form the integrated circuit package 100. This reduces the manufacturing cycle times, improves cost effectiveness, and reduces overall manufacturing costs.

In accordance with an embodiment, a method includes bonding an integrated circuit die to a carrier substrate, where an edge of the carrier substrate includes a first lower bevel and a first upper bevel that each extend from a first outer sidewall of the carrier substrate; forming a gap-filling dielectric around the integrated circuit die and along the edge of the carrier substrate; performing a bevel clean process to remove portions of the gap-filling dielectric from the edge of the carrier substrate; after performing the bevel clean process, depositing a first bonding layer on the gap-filling dielectric and the integrated circuit die; forming a first dielectric layer on an outer sidewall of the first bonding layer, an outer sidewall of the gap-filling dielectric, and the first outer sidewall of the carrier substrate; and bonding a wafer to the first dielectric layer and the first bonding layer, where the wafer includes a semiconductor substrate and a second dielectric layer on an outer sidewall of the semiconductor substrate, and where bonding the wafer to the first dielectric layer includes forming a dielectric-to-dielectric bond between the first dielectric layer and the second dielectric layer. In an embodiment, an edge of the semiconductor substrate includes a second lower bevel and a second upper bevel that extend from a second outer sidewall of the semiconductor substrate, and the wafer die further includes a second bonding layer over the semiconductor substrate; and first conductive connectors extending through the first bonding layer. In an embodiment, a top surface of the second dielectric layer is coplanar with a top surface of the first bonding layer and top surface of the first conductive connectors. In an embodiment, the method further includes forming second conductive connectors that extend through the first bonding layer, the second conductive connectors being electrically connected to conductive vias of the integrated circuit die. In an embodiment, bonding the wafer to the first bonding layer includes forming a dielectric-to-dielectric bond between the first bonding layer and the second bonding layer, and the method further includes bonding the first conductive connectors to the second conductive connectors by forming a metal-to-metal bond between one of the first conductive connectors one of the second conductive connectors. In an embodiment, performing the bevel clean process includes etching the gap-filling dielectric and the carrier substrate with a wet etch process using dilute hydrofluoric acid as an etchant. In an embodiment, the method further includes before forming the gap-filling dielectric around the integrated circuit die and the carrier substrate, depositing a liner on a top surface and sidewalls of the integrated circuit die, and the first outer sidewall of the carrier substrate, where the gap-filling dielectric is formed on the liner. In an embodiment, forming the first dielectric layer includes depositing the first dielectric layer on and in physical contact with the first outer sidewall of the carrier substrate, where the first lower bevel is not in physical contact with the first dielectric layer.

In accordance with an embodiment, a method includes forming a first wafer by bonding a first integrated circuit die and a second integrated circuit die to a carrier substrate, where edges of the carrier substrate include first beveled surfaces extending from outermost sidewalls of the carrier substrate; depositing a liner over the first integrated circuit die, the second integrated circuit die, and the carrier substrate, where the liner is in physical contact with the outermost sidewalls of the carrier substrate; and forming a gap-filling dielectric on the liner, where edges of the gap-filling dielectric include second beveled surfaces; etching portions of the gap-filling dielectric and the liner from edges of the first wafer; and bonding a second wafer to the first wafer, the second wafer including a semiconductor die. In an embodiment, etching the portions of the gap-filling dielectric and the liner from the edges of the first wafer exposes the outermost sidewalls of the carrier substrate. In an embodiment, the method further includes depositing a first bonding layer over the first wafer; depositing a first dielectric layer on sidewalls of the first wafer, where top portions of the first dielectric layer contact the second beveled surfaces of the gap-filling dielectric, the first bonding layer being disposed between the top portions of the first dielectric layer; and forming first conductive connectors that extend through the first bonding layer, the first conductive connectors being electrically connected to the first integrated circuit die and the second integrated circuit die. In an embodiment, top surfaces of the top portions of the first dielectric layer are level with top surfaces of the first bonding layer and the first conductive connectors. In an embodiment, the second wafer further includes a substrate, where edges of the substrate include second beveled surfaces extending from outermost sidewalls of the substrate; a second bonding layer over the substrate; and second conductive connectors extending through the second bonding layer. In an embodiment, the second wafer further includes a second dielectric layer on sidewalls of the substrate and sidewalls of the second bonding layer, where top portions of the second dielectric layer overlap the second beveled surfaces of the substrate, and where top surfaces of the top portions of the second dielectric layer are level with top surfaces of the second bonding layer and the second conductive connectors. In an embodiment, bonding the second wafer to the first wafer includes bonding the first dielectric layer to the second dielectric layer with a first dielectric-to-dielectric bond; bonding the first bonding layer to the second bonding layer with a second dielectric-to-dielectric bond; and bonding the first conductive connectors to the second conductive connectors with a metal-to-metal bond.

In accordance with an embodiment, a method includes bonding front-sides of a plurality of first dies to a carrier substrate; forming a first dielectric layer around each of the plurality of first dies and the carrier substrate; performing a planarization process on the first dielectric layer and the plurality of first dies to expose conductive vias of the plurality of first dies, where after the planarization process, top surfaces of the first dielectric layer, back-side surfaces of the plurality of first dies, and top surfaces of the conductive vias are substantially coplanar; bonding a second die to the back-side surfaces of the plurality of first dies and the top surfaces of the first dielectric layer, where the second die is electrically connected to each of the conductive vias of the plurality of first dies; and performing a singulation process to singulate the second die into a plurality of die regions, and to separate each of the plurality of first dies from other first dies of the plurality of first dies, where after the singulation process, each of the plurality of die regions is bonded to a corresponding one of the plurality of first dies. In an embodiment, the second die includes a first semiconductor substrate; a first bonding layer over the first semiconductor substrate; and first conductive connectors extending through the first bonding layer. In an embodiment, bonding the second die to the back-side surfaces of the plurality of first dies and the top surfaces of the first dielectric layer includes depositing a second bonding layer over the top surfaces of the first dielectric layer and the back-side surfaces of the plurality of first dies; forming second conductive connectors that extend through the second bonding layer; bonding the first bonding layer of the second die to the second bonding layer using a dielectric-to-dielectric bond; and bonding a the first conductive connectors to the second conductive connectors using metal-to-metal bonds. In an embodiment, the method further includes prior to forming the first dielectric layer, depositing a second dielectric layer over each of the plurality of first dies and the carrier substrate; and removing edge portions of the first dielectric layer and the second dielectric layer from sidewalls of the carrier substrate, where after removing the edge portions of the first dielectric layer and the second dielectric layer, the sidewalls of the carrier substrate are exposed. In an embodiment, removing the edge portions of the first dielectric layer and the second dielectric layer includes performing a bevel clean process using dilute hydrofluoric acid as an etchant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
bonding an integrated circuit die to a carrier substrate, wherein an edge of the carrier substrate comprises a first lower bevel and a first upper bevel that each extend from a first outer sidewall of the carrier substrate;
forming a gap-filling dielectric around the integrated circuit die and along the edge of the carrier substrate;
performing a bevel clean process to remove portions of the gap-filling dielectric from the edge of the carrier substrate;
after performing the bevel clean process, depositing a first bonding layer on the gap-filling dielectric and the integrated circuit die;
forming a first dielectric layer on an outer sidewall of the first bonding layer, an outer sidewall of the gap-filling dielectric, and the first outer sidewall of the carrier substrate; and
bonding a wafer to the first dielectric layer and the first bonding layer, wherein the wafer comprises a semiconductor substrate and a second dielectric layer on an outer sidewall of the semiconductor substrate, and wherein bonding the wafer to the first dielectric layer comprises forming a dielectric-to-dielectric bond between the first dielectric layer and the second dielectric layer.

2. The method of claim 1, wherein an edge of the semiconductor substrate comprises a second lower bevel and a second upper bevel that extend from a second outer sidewall of the semiconductor substrate, and the wafer die further comprises:
a second bonding layer over the semiconductor substrate; and
first conductive connectors extending through the first bonding layer.

3. The method of claim 2, wherein a top surface of the second dielectric layer is coplanar with a top surface of the first bonding layer and top surface of the first conductive connectors.

4. The method of claim 2, further comprising:
forming second conductive connectors that extend through the first bonding layer, the second conductive connectors being electrically connected to conductive vias of the integrated circuit die.

5. The method of claim 4, wherein bonding the wafer to the first bonding layer comprises forming a dielectric-to-dielectric bond between the first bonding layer and the second bonding layer, and the method further comprises:
bonding the first conductive connectors to the second conductive connectors by forming a metal-to-metal bond between one of the first conductive connectors and one of the second conductive connectors.

6. The method of claim 1, wherein performing the bevel clean process comprises etching the gap-filling dielectric and the carrier substrate with a wet etch process using dilute hydrofluoric acid as an etchant.

7. The method of claim 1, further comprising:
before forming the gap-filling dielectric around the integrated circuit die and the carrier substrate, depositing a liner on a top surface and sidewalls of the integrated circuit die, and the first outer sidewall of the carrier substrate, wherein the gap-filling dielectric is formed on the liner.

8. The method of claim 1, wherein forming the first dielectric layer comprises depositing the first dielectric layer on and in physical contact with the first outer sidewall of the carrier substrate, wherein the first lower bevel is not in physical contact with the first dielectric layer.

9. A method comprising:
forming a first wafer by:
bonding a first integrated circuit die and a second integrated circuit die to a carrier substrate, wherein edges of the carrier substrate comprise first beveled surfaces extending from outermost sidewalls of the carrier substrate;
depositing a liner over the first integrated circuit die, the second integrated circuit die, and the carrier substrate, wherein the liner is in physical contact with the outermost sidewalls of the carrier substrate; and
forming a gap-filling dielectric on the liner, wherein edges of the gap-filling dielectric comprise second beveled surfaces;
etching portions of the gap-filling dielectric and the liner from edges of the first wafer; and
bonding a second wafer to the first wafer, the second wafer comprising a semiconductor die.

10. The method of claim 9, wherein etching the portions of the gap-filling dielectric and the liner from the edges of the first wafer exposes the outermost sidewalls of the carrier substrate.

11. The method of claim 9, further comprising:
depositing a first bonding layer over the first wafer;
depositing a first dielectric layer on sidewalls of the first wafer, wherein top portions of the first dielectric layer contact the second beveled surfaces of the gap-filling dielectric, the first bonding layer being disposed between the top portions of the first dielectric layer; and
forming first conductive connectors that extend through the first bonding layer, the first conductive connectors being electrically connected to the first integrated circuit die and the second integrated circuit die.

12. The method of claim 11, wherein top surfaces of the top portions of the first dielectric layer are level with top surfaces of the first bonding layer and the first conductive connectors.

13. The method of claim 11, wherein the second wafer further comprises:
a substrate, wherein edges of the substrate comprise second beveled surfaces extending from outermost sidewalls of the substrate;
a second bonding layer over the substrate; and
second conductive connectors extending through the second bonding layer.

14. The method of claim 13, wherein the second wafer further comprises:
a second dielectric layer on sidewalls of the substrate and sidewalls of the second bonding layer, wherein top portions of the second dielectric layer overlap the second beveled surfaces of the substrate, and wherein top surfaces of the top portions of the second dielectric layer are level with top surfaces of the second bonding layer and the second conductive connectors.

15. The method of claim 14, wherein bonding the second wafer to the first wafer comprises:
- bonding the first dielectric layer to the second dielectric layer with a first dielectric-to-dielectric bond;
- bonding the first bonding layer to the second bonding layer with a second dielectric-to-dielectric bond; and
- bonding the first conductive connectors to the second conductive connectors with a metal-to-metal bond.

16. A method comprising:
- bonding front-sides of a plurality of first dies to a carrier substrate;
- forming a first dielectric layer around each of the plurality of first dies and the carrier substrate;
- performing a planarization process on the first dielectric layer and the plurality of first dies to expose conductive vias of the plurality of first dies, wherein after the planarization process, top surfaces of the first dielectric layer, back-side surfaces of the plurality of first dies, and top surfaces of the conductive vias are substantially coplanar;
- bonding a second die to the back-side surfaces of the plurality of first dies and the top surfaces of the first dielectric layer, wherein the second die is electrically connected to each of the conductive vias of the plurality of first dies; and
- performing a singulation process to singulate the second die into a plurality of die regions, and to separate each of the plurality of first dies from other first dies of the plurality of first dies, wherein after the singulation process, each of the plurality of die regions is bonded to a corresponding one of the plurality of first dies.

17. The method of claim 16, wherein the second die comprises:
- a first semiconductor substrate;
- a first bonding layer over the first semiconductor substrate; and
- first conductive connectors extending through the first bonding layer.

18. The method of claim 17, wherein bonding the second die to the back-side surfaces of the plurality of first dies and the top surfaces of the first dielectric layer comprises:
- depositing a second bonding layer over the top surfaces of the first dielectric layer and the back-side surfaces of the plurality of first dies;
- forming second conductive connectors that extend through the second bonding layer;
- bonding the first bonding layer of the second die to the second bonding layer using a dielectric-to-dielectric bond; and
- bonding the first conductive connectors to the second conductive connectors using metal-to-metal bonds.

19. The method of claim 16, further comprising:
- prior to forming the first dielectric layer, depositing a second dielectric layer over each of the plurality of first dies and the carrier substrate; and
- removing edge portions of the first dielectric layer and the second dielectric layer from sidewalls of the carrier substrate, wherein after removing the edge portions of the first dielectric layer and the second dielectric layer, the sidewalls of the carrier substrate are exposed.

20. The method of claim 19, wherein, removing the edge portions of the first dielectric layer and the second dielectric layer comprises performing a bevel clean process using dilute hydrofluoric acid as an etchant.

* * * * *